(12) United States Patent
Duong

(10) Patent No.: US 7,746,660 B1
(45) Date of Patent: Jun. 29, 2010

(54) REDUCED MOUNTING INDUCTANCE AND INCREASED SELF-RESONANT FREQUENCY RANGE

(75) Inventor: Anthony T. Duong, Saratoga, CA (US)

(73) Assignee: Xilinx, Inc., San Jose, CA (US)

( * ) Notice: Subject to any disclaimer, the term of this patent is extended or adjusted under 35 U.S.C. 154(b) by 338 days.

(21) Appl. No.: 11/546,037

(22) Filed: Oct. 10, 2006

(51) Int. Cl.
*H05K 7/10* (2006.01)

(52) U.S. Cl. .................. 361/767; 361/372; 174/255

(58) Field of Classification Search .......... 361/767, 361/372; 174/255
See application file for complete search history.

(56) References Cited

U.S. PATENT DOCUMENTS

| | | | | |
|---|---|---|---|---|
| 4,882,656 | A | * | 11/1989 | Menzies et al. ............. 361/734 |
| 5,459,642 | A | * | 10/1995 | Stoddard .................... 361/774 |
| 6,288,906 | B1 | * | 9/2001 | Sprietsma et al. ........... 361/772 |
| 6,430,030 | B1 | * | 8/2002 | Farooq et al. ............ 361/321.2 |
| 6,459,561 | B1 | | 10/2002 | Galvagni et al. |
| 6,496,355 | B1 | | 12/2002 | Galvagni et al. |
| 6,757,152 | B2 | | 6/2004 | Galvagni et al. |
| 7,239,525 | B2 | * | 7/2007 | Hsu ........................... 361/763 |
| 2002/0172023 | A1 | * | 11/2002 | Blakely et al. ............... 361/763 |
| 2006/0225916 | A1 | * | 10/2006 | Nelson et al. ................ 174/255 |

OTHER PUBLICATIONS

Xilinx, Inc., "Virtex-4 PCB Designer's Guide", Sep. 9, 2004, pp. 1-56, UG072, version 1.1, available from Xilinx, Inc., 2100 Logic Drive, San Jose, CA 95124.
Alexander, Mark, "Power Distribution System (PDS) Design: Using Bypass/Decoupling Capacitors", Feb. 28, 2005, pp. 1-27, XAPP623, version 2.1, available from Xilinx, Inc., 2100 Logic Drive, San Jose, CA 95124.

* cited by examiner

*Primary Examiner*—Hung S Bui
*Assistant Examiner*—Andargie M Aychillhum
(74) *Attorney, Agent, or Firm*—W. Eric Webostad; Thomas George

(57) ABSTRACT

Reduced mounting inductance and/or an increased self-resonant frequency range of operation for capacitor circuits of a circuit board is described. The circuit board has a mounting pad for coupling a capacitor to at least three vias arranged in a pattern and coupled to the mounting pad at least three discrete locations to reduce mounting pad inductance. Alternatively or additionally, top and bottom mounted capacitors to the circuit board have a physically and electrically common through via to provide a self-resonant frequency range of operation.

8 Claims, 6 Drawing Sheets

REDUCED MOUNTING INDUCTANCE AND INCREASED SELF-RESONANT FREQUENCY RANGE

FIELD OF THE INVENTION

One or more aspects of the invention relate generally to integrated circuits and printed circuit boards, and, more particularly, to a reduced mounting inductance and/or an increased self-resonant frequency range for capacitor circuits of a circuit board.

BACKGROUND OF THE INVENTION

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. Notably, as used herein, "include" and "including" mean including without limitation.

One such FPGA is the Xilinx Virtex® FPGA available from Xilinx, Inc., 2100 Logic Drive, San Jose, Calif. 95124. Another type of PLD is the Complex Programmable Logic Device ("CPLD"). A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. Other PLDs are programmed by applying a processing layer, such as a metal layer, that programmably interconnects the various elements on the device. These PLDs are known as mask programmable devices. PLDs can also be implemented in other ways, for example, using fuse or antifuse technology. The terms "PLD" and "programmable logic device" include but are not limited to these exemplary devices, as well as encompassing devices that are only partially programmable.

For purposes of clarity, FPGAs are described below though other types of PLDs may be used. FPGAs may include one or more embedded microprocessors. For example, a microprocessor may be located in an area reserved for it, generally referred to as a "processor block."

Heretofore, decoupling capacitors for high-frequency applications were coupled to a circuit board using single vias for each terminal. Furthermore, such decoupling capacitors, though in some instances have been mounted on both top and bottom sides of a circuit board such as a printed circuit board ("PCB"), were heretofore not physically and electrically coupled to one another by a common via. However, mounting inductance associated with coupling, for example, a two terminal discrete capacitor to a PCB may be a significant limitation on performance or may involve using more costly capacitors to obtain a target performance, or a combination thereof.

Accordingly, it would be desirable and useful to reduce mounting inductance associated with decoupling capacitors. Furthermore, it would be additionally desirable and useful to enhance self-resonance associated with such decoupling capacitors.

SUMMARY OF THE INVENTION

One or more aspects of the invention relate generally to integrated circuits and printed circuit boards and, more particularly, to a reduced mounting inductance and/or an increased self-resonant frequency range for capacitor circuits of a circuit board.

An aspect of the invention is a circuit board which includes a mounting pad for being coupled to a capacitor, and at least three holes for receiving conductive material to provide at least three vias. The at least three holes are arranged in a pattern to reduce mounting inductance. The conductive material of the at least three holes is coupled to the mounting pad at least three discrete locations.

An aspect of the invention is a circuit board including a first mounting pad and a second mounting pad for respectively coupling thereto a first terminal and a second terminal of a high-frequency decoupling capacitor. The circuit board has a first pattern of holes associated with the first mounting pad and a second pattern of holes associated with the second mounting pad. The first pattern of holes and the second pattern of holes are for receiving conductive material to provide vias. The first pattern of holes and the second pattern of holes are configured to reduce mounting inductance associated with the high-frequency decoupling capacitor mounted to the circuit board.

An aspect of the invention is a circuit board that has a plurality of internal conductive layers between a top surface and a bottom surface of the circuit board. The circuit board includes a first capacitor disposed on the top surface and a second capacitor disposed on the bottom surface. The first capacitor is coupled to the second capacitor by a first via extending from the top surface to the bottom surface, and the first capacitor is coupled to a first internal conductive layer of the plurality of internal conductive layers by a second via extending from the top surface to the first internal conductive layer. The second capacitor is coupled to a second internal conductive layer of the plurality of internal conductive layers by a third via extending from the bottom surface to the second internal conductive layer. The first capacitor has associated therewith a first self-inductance, and the second capacitor has associated therewith a second self-inductance. The first self-inductance is different than the second self-inductance to provide a self-resonant frequency range of operation.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Figure 1C:
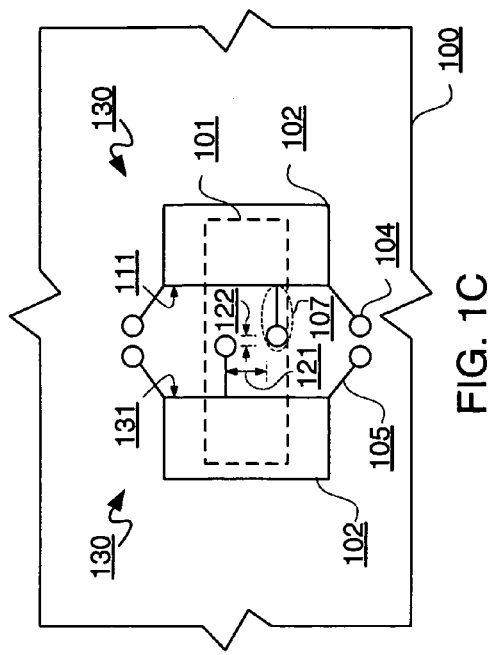
FIGS. 1A through 1D are block diagrams depicting respective exemplary embodiments of a portion of a printed circuit board ("PCB") having mounted thereon a capacitor.
Figure 1D:
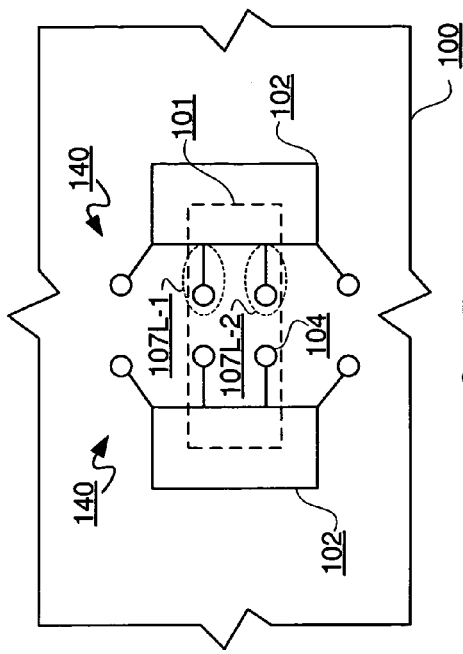
Figure 1A:
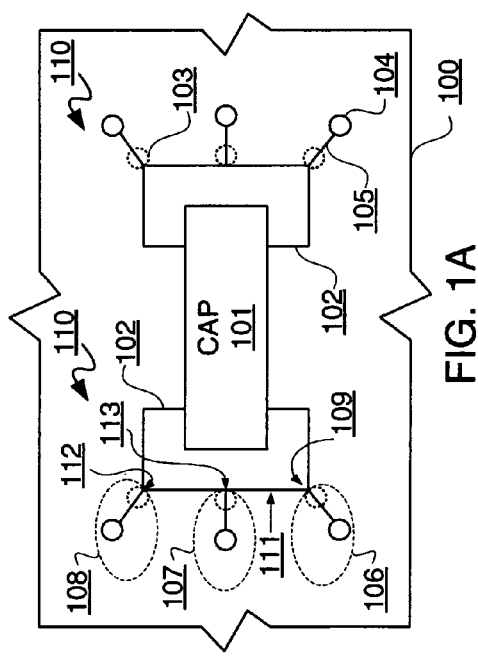

FIG. 1A is a block diagram depicting an exemplary embodiment of a portion of a PCB 100 (hereinafter "PCB 100") having mounted thereon a capacitor 101. Capacitor 101 is coupled to right and left mounting pads 102. Vias 104 are coupled at respective locations of mounting pads 102 by respective traces 105. Notably, traces 105 may be omitted and vias 104 may be more directly connected at discrete locations of mounting pads 102 as indicated by dashed circles 103. However, for purposes of clarity by way of example and not limitation, it shall be assumed that traces 105 are used.

Vias 104 and traces 105 in combination with mounting pads 102 form what are termed right and left respective "three-pointed crown" configurations 110. With reference to the crown configuration 110 on the left, which in this example is a mirrored version of the crown configuration on the right, via 104 and trace 105 of conductor assembly 106 has its trace 105 connected at lower left corner 109 of left mounting pad 102. Via 104 and trace 105 of conductor assembly 107 are connected at a location 113 of a left side 111 of left mounting pad 102. Conductor assembly 108 having a via 104 and a trace 105 is connected to a left upper corner 112 of left mounting pad 102. Notably, traces 105 of conductor assemblies 106 and 108 are respectively at approximately +45 and –45 degree angles, and trace 105 associated with conductor assembly 107 is at an angle of approximately 0 degrees. However, angular orientations other than these specific examples may be used. Furthermore, right and left three-pointed crown configurations 110 need not be mirrored.

Each three-pointed crown configuration 110 of FIG. 1A represents a pattern of vias 104 to reduce "mounting" inductance or "mounting pad" inductance. Notably, vias 104 may be closely spaced with reference to mounting pads 102, in other words, traces 105 may be maintained substantially short in order to further reduce mounting inductance.

Figure 1B:
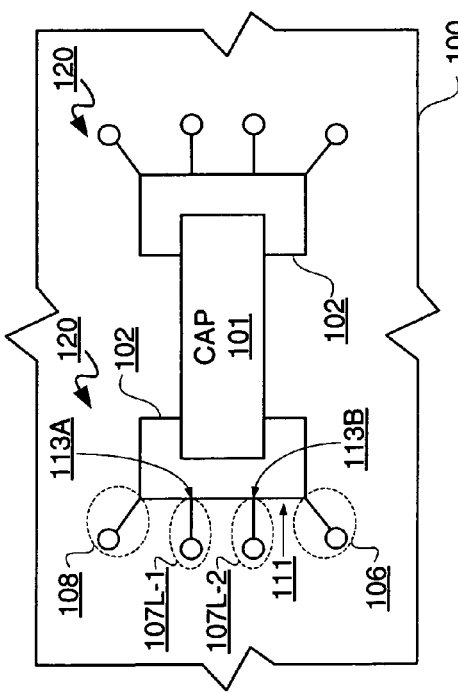

FIG. 1B is a block diagram depicting an alternative exemplary embodiment of a capacitor 101 mounted on PCB 100. In this example embodiment, a "four-pointed crown" configuration 120, rather than a three-pointed crown configuration 110 of FIG. 1A, is illustratively shown. Rather than one conductor assembly 107 along a side of a mounting pad 102, four-pointed crown configuration 120 has two conductor assemblies 107L-1 and 107L-2 connected to a same side, such as for example the left side 111 of left mounting pad 102 for the four-pointed crown configuration 120 on the left. Notably, each of conductor assemblies 107L-1, 107L-2, 106, and 108 is connected to left mounting pad 102 at a respective discrete location thereof.

With simultaneous reference to FIGS. 1A and 1B, three-pointed crown configuration 110 and four-pointed crown configuration 120 are further described. For three-pointed crown configuration 110, conductor assembly 107 is connected at a location 113 along side 111, or more particularly, in this example trace 105 is connected at location 113. In four-pointed crown configuration 120 of FIG. 1B, conductor assemblies 107L-1 and 107L-2 are connected at spaced apart respective locations 113A and 113B along left side 111 of left mounting pad 102. Thus, for the example embodiment illustratively shown, respective traces 105 of conductor assemblies 107L-1 and 107L-2 are connected at separate and discrete locations along left side 111 of left mounting pad 102. Furthermore, it should be appreciated that in both three-pointed crown configuration 110 and four-pointed crown configuration 120, each via 104 is coupled to a discrete location with respect to a mounting pad 102, and thus no two vias are coupled to a same location along a periphery of a mounting pad, such as mounting pads 102.

FIG. 1C is a block diagram depicting yet another alternative embodiment of a PCB 100 for having capacitor 101, illustratively shown in phantom, mounted thereon. Notably, capacitor 101 is illustratively shown in phantom using a dashed box to more clearly illustrate vias 104 and associated traces 105 located below (i.e., underneath) such capacitor 101, either in whole or in part, when such capacitor 101 is mounted to PCB 100. With simultaneous reference to FIGS. 1A and 1C, PCB 100 of FIG. 1C is further described.

In FIG. 1A, three-pointed crown configurations 110 had vias 104 and traces 105 generally emanating away from capacitor 101. In FIG. 1C, three-pointed crown configurations 130 have vias 104 and traces 105 generally emanating in an inward direction generally toward capacitor 101. Thus, generally, three-pointed crown configurations 110 of FIG. 1A are outward facing and three-pointed crown configurations 130 of FIG. 1C are inward facing with respect to capacitor 101. Notably, a combination of inward and outward facing crown configurations may be used, though not illustratively shown. Furthermore, a combination of three-pointed and four-pointed crown configurations may be used.

Right and left conductor assemblies 107 connected to mounting pads 102 of FIG. 1C and which may be located wholly or partially under capacitor 101 may be offset from one another by an offset distance 121. Distance 121 may be sufficient such that there is no overlap between vias 104 of conductor assemblies 107 located between left and right mounting pads 102. This is because spacing between right side 131 of left mounting pad 102 and left side 111 of right side mounting pad 102 is such that there is some horizontal overlap 122 with respect to right side and left side conductor assemblies 107 respectively associated with the right side of left mounting pad 102 and the left side of right mounting pad 102. Alternatively, right side and left side conductor assemblies 107 respectively associated with the right side of left mounting pad 102 and the left side of right mounting pad 102 may be sufficiently spaced apart such that there is no overlap 122. Additionally, it should be appreciated that conductor assemblies 107 need not be connected at the center of a side of a mounting pad with respect to the intersection between a trace 105 and an associated mounting pad 102, but may be located off center along such side.

FIG. 1D is a block diagram depicting still yet another alternative embodiment of PCB 100 having a capacitor 101, illustratively shown in phantom. Again, capacitor 101 is illustratively shown by a dashed box in order to more clearly illustrate vias 104 and traces 105 located, in whole or in part, under capacitor 101. In this exemplary embodiment, a four-pointed crown configuration 140 is illustratively shown where each crown configuration 140 is inward facing with respect to capacitor 101. Furthermore, in this exemplary embodiment, there is sufficient spacing between the right side of left mounting pad 102 and left side of right mounting pad 102, such that there is no horizontal overlap between right and left side vias 104 associated with conductor assemblies 107L-1 and 107L-2, respectively.

With simultaneous reference to FIGS. 1A through 1D, it should be appreciated that in each of the conductor assemblies 110, 120, 130, and 140, at least two vias 104 are coupled using associated traces 105 at respective corners of a mounting pad. With respect to FIGS. 1B and 1D, at least two vias are coupled to discrete locations along a side of a mounting pad using respective traces 105.

Figure 2B:
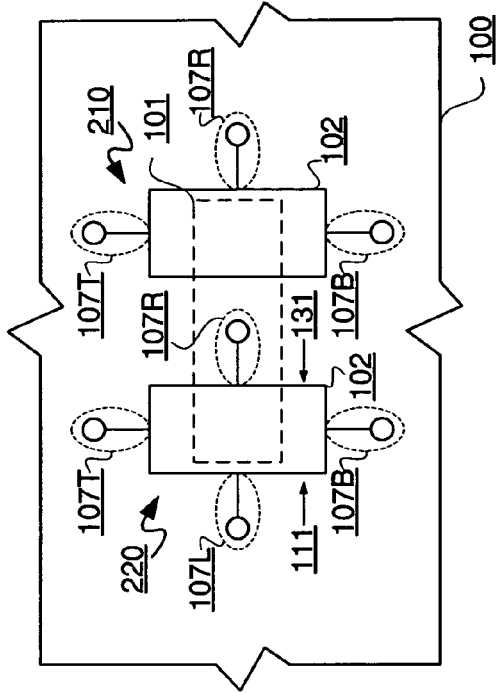
FIGS. 2A through 2C are block diagrams depicting respective exemplary embodiments of a PCB having mounted thereon a capacitor.
Figure 2C:
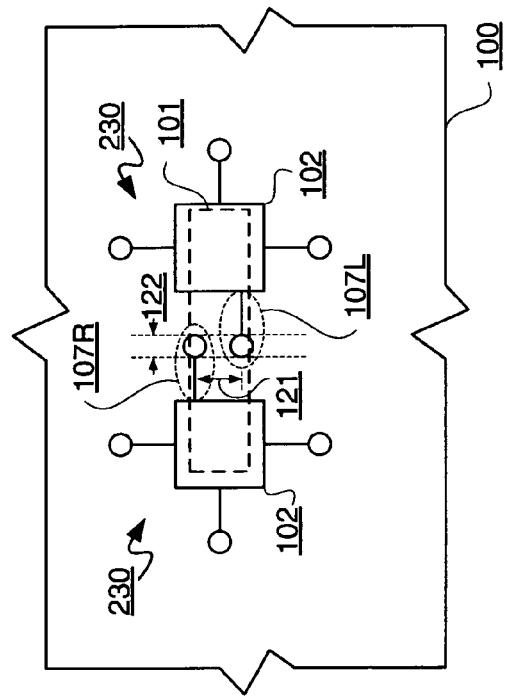
Figure 2A:
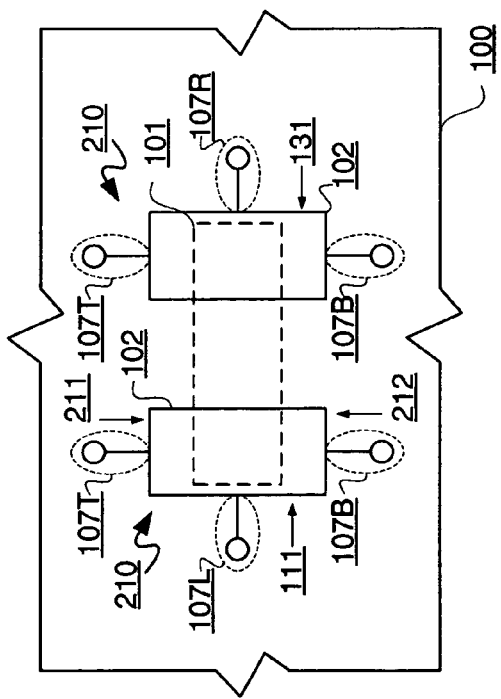

In FIG. 2A, where there is shown a block diagram depicting another alternative embodiment of a PCB 100 for having a capacitor 101 mounted thereon, conductor assemblies 107 are respectively coupled to two or more sides of a mounting pad. In FIG. 2A, a left side mounting pad 102 has connected thereto a conductor assembly 107T along a top side 211, a conductor assembly 107L connected along a left side 111, and a conductor assembly 107B coupled along a bottom side 212. Conductor assemblies 107T, 107L, and 107B in combination with mounting pad 102 is what is termed herein as a "three-sided via configuration" 210. Left side three-sided via configuration 210 may be mirrored to provide a right side three-sided via configuration 210 where a conductor assembly 107R is connected along a right side 131 of a right mounting pad 102 instead of left side conductor assembly 107L.

FIG. 2B is a block diagram depicting yet another alternative embodiment of a PCB 100 for having a capacitor 101 mounted thereon. FIG. 2B is similar to FIG. 2A, except that rather than a three-sided via configuration 210 for a left mounting pad 102, what is termed herein as "a four-sided via configuration" 220 for a left side mounting pad 102 is illustratively shown. Four-sided via configuration 220 includes a right side conductor assembly 107R connected to a right side 131 of a left mounting pad 102.

With simultaneous reference to FIGS. 2A and 2B, it should be appreciated that even though instances of outward facing three-sided via configurations 210 are illustratively shown, inward facing three-sided via configurations 210 may be used. Again, conductor assemblies 107 generally located between mounting pads 102 may be offset for instances where mounting pads 102 are spaced sufficiently close that vias 104 would otherwise touch, as previously described with reference to FIG. 1C.

FIG. 2C is a block diagram depicting still yet another alternative embodiment of a PCB 100 for having mounted thereon a capacitor 101. In FIG. 2C, mounting pads 102 are generally shown having a square geometry, whereas previously mounting pads 102 of FIGS. 2A and 2B for example have been illustratively shown as having a rectangular geometry. It should be appreciated that any of a variety of known geometries may be used for mounting pads 102. Left and right four-sided via configurations 230 are illustratively shown where a right side conductor assembly 107R is connected to a left side mounting pad 102 and a left side conductor assembly 107L is connected to a right side mounting pad 102. In this example, because there is a horizontal overlap 122 as between conductor assemblies 107R and 107L, such conductor assemblies 107R and 107L are spaced apart by a vertical offset 121. This may involve having one or more of conductor assemblies 107R and 107L not located at or approximate to a center of an associated right and left side respectively of left and right side mounting pads 102.

Figure 3B:
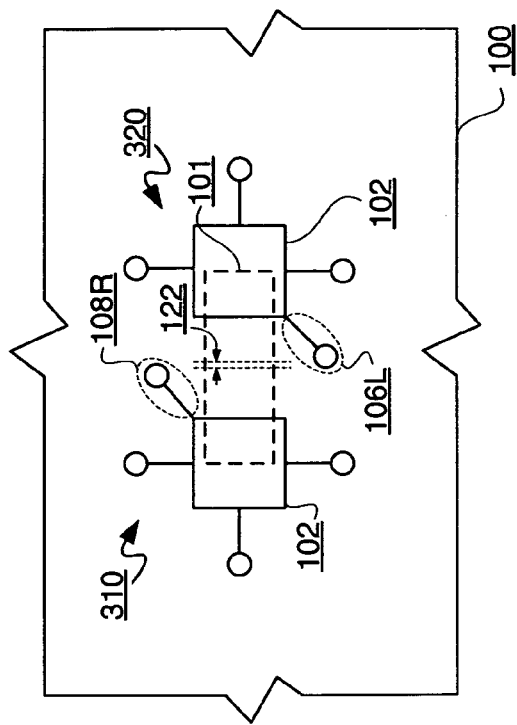
FIGS. 3A and 3B are block diagrams depicting respective exemplary embodiments of a PCB for mounting a capacitor thereon.
Figure 3A:
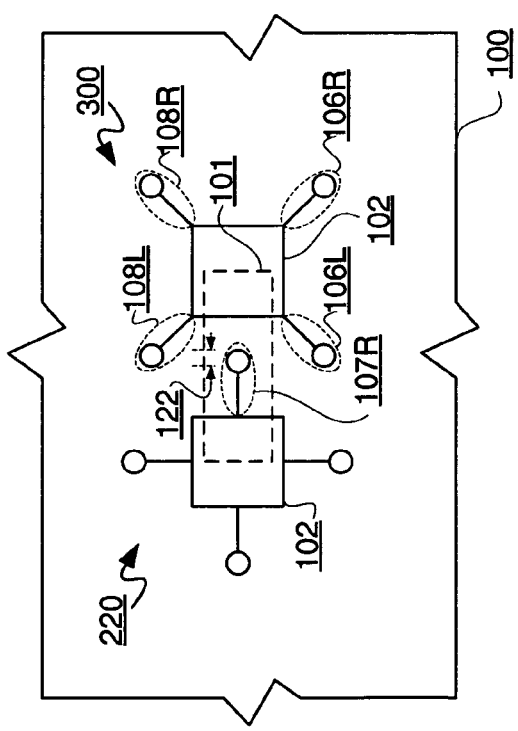

FIG. 3A is a block diagram depicting another alternative embodiment of a PCB 100 for mounting a capacitor 101 thereon. A four-sided via configuration 220 is illustratively shown paired with what is termed herein as a "four-corner via configuration" 300. Four-corner via configuration includes a mounting pad 102 having attached thereto at respective corners thereof, a left side conductor assembly 108L, a right side conductor assembly 108R, a left side conductor assembly 106L, and a right side conductor assembly 106R. Recall that conductor assemblies 108 are associated with a top portion of a mounting pad and conductor assemblies 106 are associated with a bottom portion of a mounting pad. Notably, in this example illustratively shown there is a horizontal overlap 122 between for example conductor assembly 108L of four-corner via configuration 300 and conductor assembly 107R of four-sided via configuration 220. Notably, there need not be any overlap 122.

FIG. 3B is a block diagram depicting yet another alternative embodiment of a PCB 100 for mounting a capacitor 101 thereon. Examples of what is termed herein as a "three-sided and one corner via configuration" are illustratively shown. For three-sided and one corner via configuration 310, a conductor assembly 108R is attached to an upper right corner of left mounting pad 102 along with three conductor assemblies as previously described with reference to a left three-sided via configuration 210 of FIG. 2A. For three-sided and one corner via configuration 320, a conductor assembly 106L is attached to a lower left corner of right mounting pad 102, where the remainder of configuration 320 is previously described with reference to a right three-sided via configuration 210 of FIG. 2A.

Figure 4B:
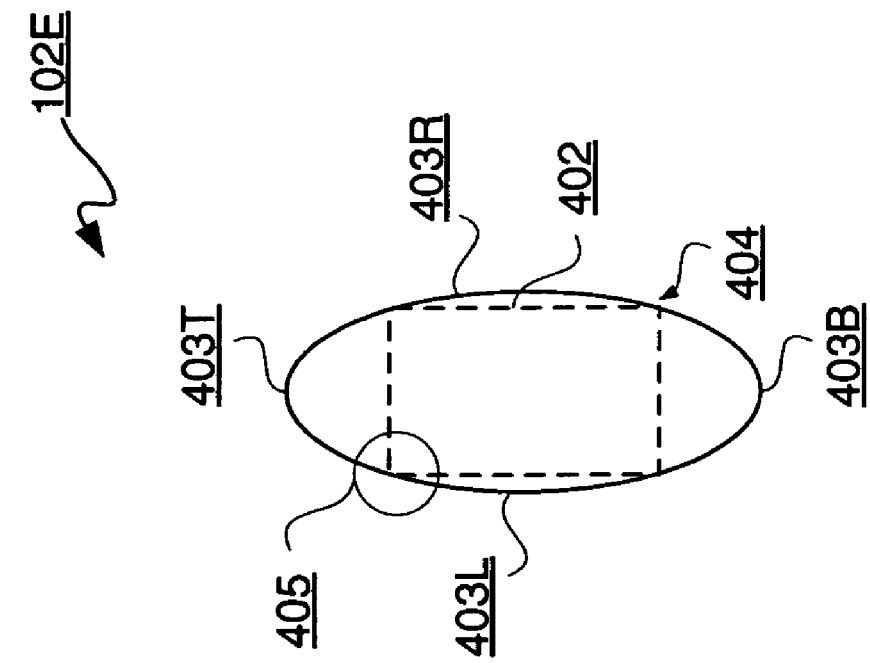
FIG. 4B is a top view depicting an exemplary embodiment of an elliptical mounting pad.
Figure 4A:
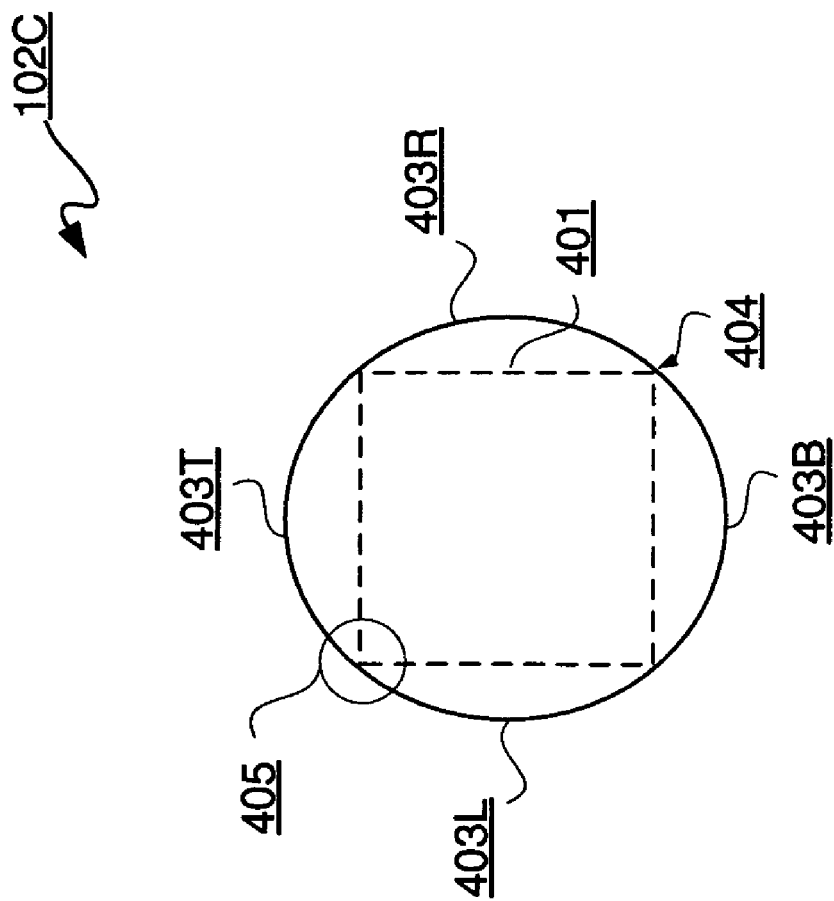
FIG. 4A is a top view depicting an exemplary embodiment of a circular mounting pad.

FIG. 4A is a top view depicting an exemplary embodiment of a circular mounting pad 102C, and FIG. 4B is a top view depicting an exemplary embodiment of an elliptical mounting pad 102E. With simultaneous reference to FIGS. 4A and 4B, mounting pads 102C and 102E are further described. A square, illustratively shown in phantom, 401 may be generally inscribed within mounting pad 102C. Notably, square 401, or rectangle 402, need not actually be inscribed, but the inscription of such is shown for purposes of illustration to illustrate how a circle may be defined as having sides and/or corners for purposes of coupling vias, as described herein.

Thus each arch length from corner 404 to corner 404 of an inscribed square 401 or rectangle 402 may be considered a respective side. Thus, mounting pad 102C may be considered as having sides 403T, 403B, 403R, and 403L. Likewise, mounting pad 102E, may be considered as having sides 403T, 403B, 403R, and 403L. Notably, though these sides 403T, 403B, 403R, and 403L are not straight lines, but are rather arch lengths, such arch lengths may be interpreted as sides, for purposes of defining where to couple vias 104, as previously described. Additionally, regions of corners 404 generally indicated by circles 405 may be used to indicate where vias 104 may be coupled to corners of a circular or elliptical mounting pad 102C or 102E, respectively.

Accordingly, it should be appreciated that multiple vias may be coupled to a mounting pad, and this coupling may be at discrete locations of the mounting pad. Conductor assemblies as described herein may be connected to two or more sides of a mounting pad or may be connected to two or more corners of a mounting pad, or a combination thereof. Furthermore, one or more conductor assemblies may be coupled to a side of a mounting pad where one or more conductor assemblies are coupled to corners of a mounting pad. Though circles, ellipses, squares, and rectangles may be thought of as having four sides and/or four corners, other geometric shapes with fewer than four sides/corners, such as triangles, or more than four sides/corners, such as pentagons, hexagons, and so on, may be used. Thus a mounting pad may be thought of as having at least three sides/corners, and for the examples illustratively shown may be thought of as having at least four sides/corners. Capacitors 101 as described herein are generally high-frequency decoupling capacitors. High-frequency decoupling capacitors generally are 1 uF or less for frequencies of 3 Mhz or more.

Notably, capacitors 101 may be mounted on a top or a bottom surface of a PCB 100, or both as described below herein.

Figure 5:
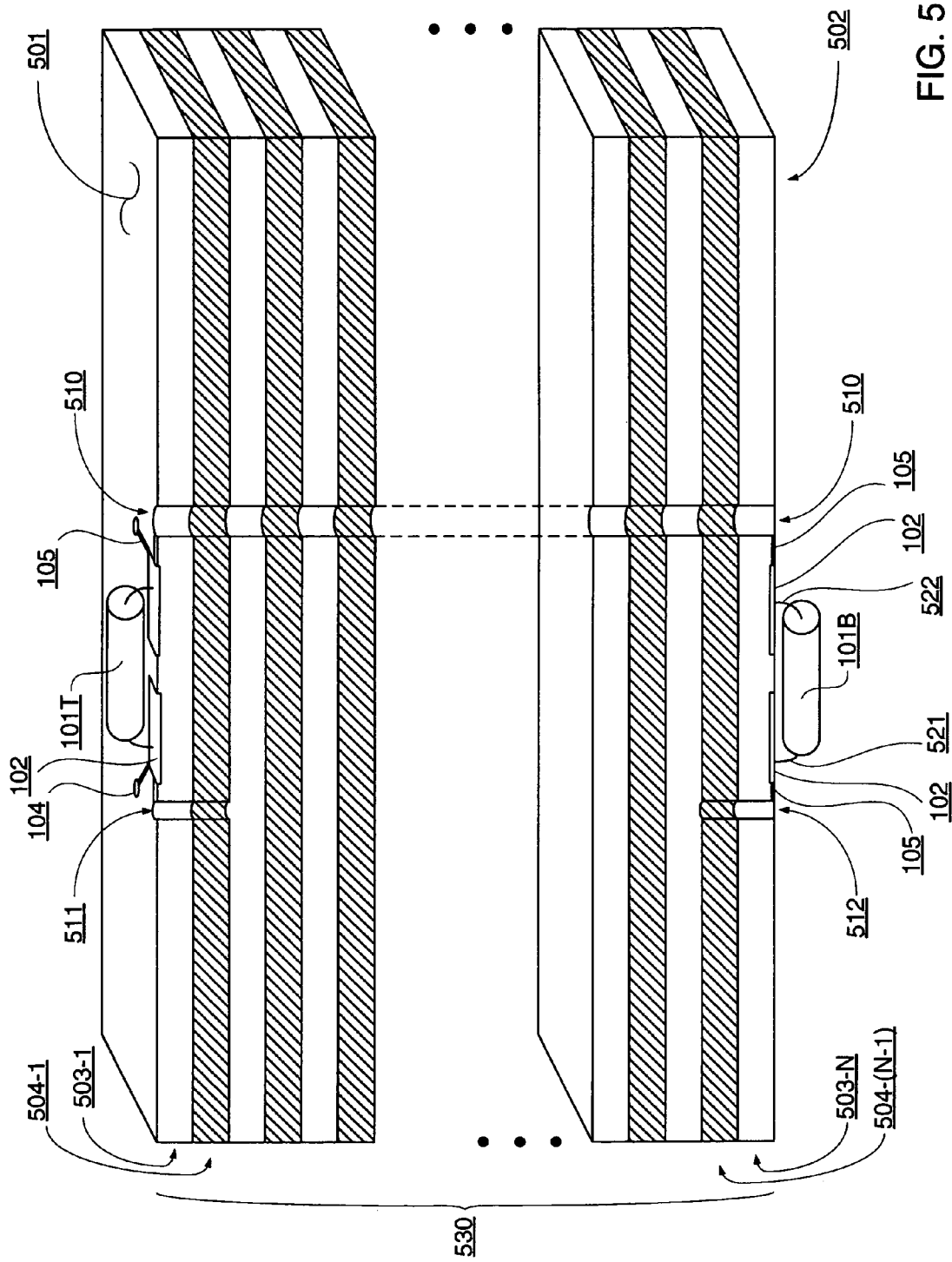
FIG. 5 is a perspective cross-sectional view depicting an exemplary embodiment of a PCB having a top surface and a bottom surface as well as a plurality of layers therebetween.

FIG. 5 is a perspective cross-sectional view depicting an exemplary embodiment of a PCB 500 having a top surface 501 and a bottom surface 502 as well as a plurality of layers 530 therebetween. An uppermost layer 503-1 and a lowermost layer 503-N, for N a positive integer greater than 3, of layers 530 may each be formed of a generally dielectric material. Immediately below uppermost layer 503-1 may be a generally conductive layer 504-1, and immediately above lowermost layer 503-N may be a generally conductive layer 504-(N−1). Thus, there may be located between pairs of dielectric layers a conductive layer for providing PCB 500.

Formed in PCB 500 may be a via 510 which is a through hole extending from top surface 501 to bottom surface 502. Notably, a conductive material disposed in such hole used to provide via 510 is not illustratively shown for purposes of clarity. Furthermore, conductive material disposed in non-through holes respectively associated with vias 511 and 512 is not illustratively shown for purposes of clarity. Additionally, even though vias as illustratively shown herein are generally cylindrical, it should be appreciated that other known volumes for vias may be used.

With continuing reference to FIG. 5, a top mounted capacitor 101T is mounted to upper surface 501 of PCB 500, and a bottom mounted capacitor 101B is mounted to bottom surface 502 of PCB 500. Notably, PCB 500 may be PCB 100 as previously described. Additionally, it should be appreciated that capacitor 101T or 101B, or both, may be examples of capacitor 101 as previously described.

Capacitors 101T and 101B are each two terminal devices where one terminal 521 is coupled to one mounting pad 102 and another terminal 522 is coupled to another mounting pad 102, for coupling to top and bottom surfaces 501 and 502, respectively. Via 511 associated with capacitor 101T is not, however, a through via, as is via 510. Rather, via 511 extends to a conductive layer located between dielectric layers 503-1 and 503-N, which in this example is conductive layer 504-1. Furthermore, via 512 associated with capacitor 101B is not a through via, but extends to a conductive layer located between dielectric layers 503-1 and 503-N, which in this example is conductive layer 504-(N−1). Although vias 511 and 512 are illustratively shown going to the first conductive internal layer from each side of PCB 500 for illustration purposes only, such vias 511 and 512 may respectively extend to any of the internal conductive layers 530. Also, vias 511 and 512 are illustratively shown as "blind" vias, meaning that they are non-through vias. However, in other implementations, vias 511 and 512 may, though they need not, connect with one another or connect to a common internal layer. Additionally, it should be understood that internal conductive layers, such as ground planes or power supply planes for example, may be electrically and physically tied together by other vias (not shown illustratively) as is known. In this particular example, capacitors 101T and 101B are illustratively shown as being laid out as mirrored capacitors. However, non-mirrored capacitors may be used. In either mirrored or non-mirrored embodiments, capacitors 101T and 101B share an electrically and physically common node by through via 510 which directly couples a terminal of each of those capacitors to one another. Notably, it may be that other terminals of capacitors 101T and 101B as respectively associated with non-through vias 512 are electrically common because associated layers, such as layer 504-1 and layer 504-(N−1) in this example, are an electrically common node. However, this type of connectivity is not what is meant by a direct coupling as is described with reference to through via 510 coupling a terminal of each of capacitors 101T and 101B to one another.

It should be appreciated that top mounted capacitor 101T and bottom mounted capacitor 101B may have different mounting inductances, and as such may have different resonant frequencies. Furthermore, it should be appreciated that one or more via patterns as previously described may be used for coupling one or more of capacitors 101T and 101B to PCB 500. Notably, via patterns described herein may be tailored to tune the mounting inductance to a target value or toward a target value as determined by a designer, which may vary from application to application.

Through via 510 may have wider diameter than a non-through via, such as each of non-through vias 511 and 512, in order to have a sufficient aspect ratio to form such through via 510. Thus, diameter of through via 510 is illustratively shown as being substantially larger than diameters of non-through vias 511 and 512. Accordingly, via diameter may be taken into account for purposes of circuit board via layout, as well as being a factor in determining mounting inductance.

Figure 6:
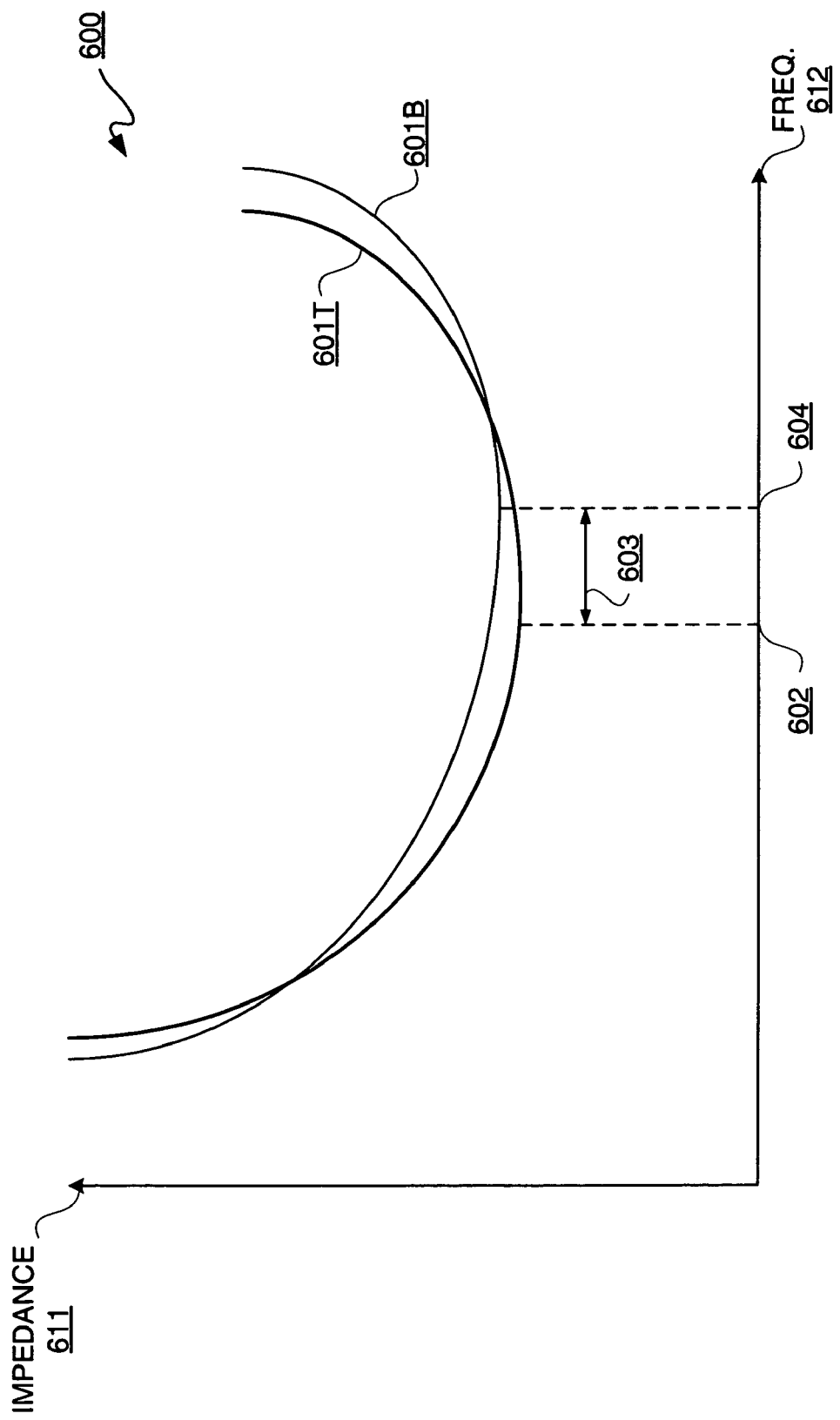
FIG. 6 is a graphical diagram depicting an exemplary embodiment of a frequency versus impedance plot.

FIG. 6 is a graphical diagram depicting an exemplary embodiment of a frequency versus impedance plot 600. Notably, plot 600 is merely for purposes of illustration and does not reflect any particular actual capacitors.

Suppose top mounted capacitor 101T of FIG. 5 has a frequency 612 versus impedance 611 characteristic curve as indicated by thick black line 601T. Furthermore, suppose that bottom mounted 101B of FIG. 5 has a frequency 612 versus impedance 611 characteristic curve as generally indicated by thin black line 601B. Furthermore, suppose that resonant frequency 602 is associated with characteristic curve 601T, and that resonant frequency 604 is associated with characteristic curve 601B. Notably, each capacitor, such as capacitors 101T and 101B of FIG. 5, has an associated self-inductance. With each associated self-inductance of a capacitor, there is an associated resonant frequency, as is known. In accordance with the description herein, self-inductances of top and bottom mounted capacitors 101T and 10B have different resonant frequencies respectively associated therewith.

Thus, separation between resonant frequencies 602 and 604 is a resonant frequency range of operation 603. Accordingly, it should be appreciated that by having top and bottom mount capacitors 101T and 101B sharing a through via 510, a range of resonant frequency 603 for purposes of operation, such as for high-frequency decoupling capacitance, may be provided by using capacitors with different self-inductances. Accordingly, it should be appreciated that self-inductances associated with capacitors 101T and 101B having a shared through via 510 may have a wider resonant frequency range of operation 603 than a single capacitor. Notably, self-inductance may be affected by mounting inductance. In other words, mounting inductance may be taken into account with respect to determining a resonant frequency range of operation. Furthermore, because such mounting inductance may be reduced by via patterning as described herein, such via patterning may be used to effect a target resonant frequency range of operation.

Mounting inductance may be reduced, for either or both a top and bottom mounted capacitor. By reducing mounting inductance, anti-resonant frequency associated with a capacitor having via patterning as described herein may be reduced. Additionally, if a designer knows that mounting inductance is too high or a range of self-resonance is too small, or a combination thereof, the designer may use via patterning, or a top/bottom capacitor pair with a through via, or a combination thereof, as described herein.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A circuit board comprising:
   a mounting pad for being coupled to a capacitor;
   at least three holes for receiving conductive material to provide at least three vias;
   the at least three holes being arranged in a pattern to reduce mounting inductance;
   at least three breakout traces, each of the at least three breakout traces directly coupling a corresponding one of the at least three vias to the mounting pad, wherein two or more of the at least three breakout traces are coupled to corners of the mounting pad and at an angle of approximately 45 degrees; and
   the conductive material of the at least three holes being coupled to the mounting pad at least three discrete locations,
   wherein the at least three breakout traces and the at least three holes are not located under the capacitor when the capacitor is mounted to the circuit board.

2. The circuit board according to claim 1, wherein the capacitor is a discrete high-frequency decoupling capacitor.

3. The circuit board according to claim 1, wherein the mounting pad includes at least four sides; and
   wherein the at least three vias are respectively coupled to three of the at least four sides.

4. The circuit board according to claim 1, wherein the mounting pad includes at least four-corners; and
   wherein the at least three vias are respectively coupled to three of the at least four-corners.

5. The circuit board according to claim 1,
   wherein the mounting pad and the capacitor are on a top surface of the circuit board, and the at least three holes are on the top surface of the circuit board;
   and the circuit board further comprises:
   another capacitor on a bottom surface of the circuit board;
   a first one of the at least three vias to couple the capacitor to the other capacitor, wherein the first one of the at least three vias extends from the top surface of the circuit board to the bottom surface of the circuit board;
   a second one of the at least three vias to couple the capacitor to a first internal conductive layer of a plurality of internal conductive layers, wherein the second one of the at least three vias extends from the top surface of the circuit board to the first internal conductive layer of the plurality of internal conductive layers; and
   a third one of the at least three vias to couple the other capacitor to a second internal conductive layer of the plurality of internal conductive layers, wherein the third one of the at least three vias extends from the bottom surface of the circuit board to the second internal conductive layer;
   wherein the capacitor has associated therewith a first self-inductance;
   wherein the other capacitor has associated therewith a second self-inductance; and
   wherein the first self-inductance is different from the second self-inductance to provide a self-resonant frequency range of operation.

6. The circuit board according to claim 2, wherein the discrete high-frequency decoupling capacitor is for a frequency equal to or greater than approximately 3 MHz.

7. The circuit board according to claim 5, further comprising:
   another mounting pad located on the bottom surface for coupling the other capacitor;
   at least three other holes arranged in another pattern on the bottom surface of the circuit board, wherein the at least three other holes receive conductive material to provide the at least three vias,
   wherein the other pattern of holes are configured to reduce another mounting inductance associated with the other capacitor mounted to the bottom surface of the circuit board.

8. The circuit board according to claim 7, wherein the self-resonant frequency range of operation is bounded by a first self-resonant frequency associated with the first self inductance and a second self-resonant frequency associated with the second self inductance.

* * * * *